United States Patent [19]

Beale

[11] 4,415,420

[45] Nov. 15, 1983

[54] CUBIC BORON NITRIDE PREPARATION

[75] Inventor: Harry A. Beale, Columbus, Ohio

[73] Assignee: Applied Coatings International, Inc., Columbus, Ohio

[21] Appl. No.: 464,304

[22] Filed: Feb. 7, 1983

[51] Int. Cl.$^3$ ............................................. C23C 15/00
[52] U.S. Cl. ........................... 204/192 N; 204/192 R; 204/192 C; 204/164; 427/38
[58] Field of Search ............ 427/38; 204/164, 192 R, 204/192 N, 192 C

[56] References Cited

U.S. PATENT DOCUMENTS

| | | | |
|---|---|---|---|
| 3,551,312 | 12/1970 | Kahng et al. | 204/164 |
| 3,708,325 | 1/1973 | Kurtz | 204/192 N |
| 4,194,930 | 3/1980 | Tanaka et al. | 204/192 N |
| 4,297,387 | 10/1981 | Beale | 427/38 |
| 4,309,227 | 1/1982 | Kajikawa et al. | 204/164 |

Primary Examiner—Arthur P. Demers
Attorney, Agent, or Firm—John L. Gray

[57] ABSTRACT

Cubic boron nitride is deposited on a substrate by an activated reactive evaporation method involving heating a substrate in a vacuum, evaporating metal vapors into a zone between the substrate and the metals source, said source consisting of pure boron or boron and a material selected from the group consisting of the elements chromium, nickel, cobalt, and manganese co-evaporated, or an alloy consisting essentially of from 0.1 weight percent to 5.0 weight percent of at least one of the elements chromium, nickel, cobalt, and manganese, the balance being boron, introducing ammonia gas into the zone, and generating an electrical field in the zone in order to ionize the metal vapors and gas atoms in the zone.

8 Claims, No Drawings

CUBIC BORON NITRIDE PREPARATION

BACKGROUND OF THE INVENTION

Present day commercially available boron nitride having a cubic structure at room temperature generally has been prepared by using high pressure technology and processing techniques. Cubic boron nitride (CBN) produced by this process is expensive because of the complexity and attendant low volume associated with such high pressure processing.

Cutting tools coated with CBN are particularly attractive because higher cutting rates, compared to tungsten carbide, are possible. Also because a coolant can be used with CBN cutting tools, better surface finishes usually can be obtained than when using the $Al_2O_3$-TiC-TiN-TiO$_2$ type cutting tools dry.

U.S. Pat. No. 3,918,219, Wentorf, Jr., et al., discloses the conversion of CBN from hexagonal boron nitride (HBN) using certain aluminum alloys as catalysts. This process is carried on at a high pressure and high temperature. CBN can be formed from BN at temperatures near 1800° C. and at pressures of approximately 85 kilobars with various materials such as alkali and alkaline earth metals, and aluminide forming materials as catalysts.

U.S. Pat. No. 3,791,852, Bunshah, describes a process and apparatus for the production of carbide films by physical vapor deposition by means of an activated reactive evaporation deposition technique. This patent, including its drawing figure of a typical apparatus and description thereof, is incorporated in this disclosure by reference.

U.S. Pat. No. 4,297,387, Beale, discloses a process of making CBN utilizing an activated reactive evaporation technique which involves evaporating an alloy of boron and aluminum and at least one of cobalt, nickel, manganese, or other aluminideforming elements in the presence of ammonia gas while generating an electrical field in the zone for ionizing the metal vapors and gas atoms in the zone. The temperature is maintained at least at 300° C. with a preferred temperature of between 500° C. and 1100° C. with the ammonia gas pressure preferably between $1 \times 10^{-4}$ torr to $8 \times 10^{-3}$ torr.

U.S. Pat. No. 4,297,387, Beale, relies on the vaporization of a cubic phase nucleator which also functions as a barrier to possible dislocation motion or transformation nuclei formation in the form of an aluminide made from cobalt, nickel, manganese, zirconium, or iron.

SUMMARY OF THE INVENTION

The present invention involves the formation of CBN at relatively low temperatures utilizing the activated reactive evaporation deposition process without the need to include aluminum as an alloying element in the metals alloy source so as to form an aluminide. Pure boron or boron and a material selected from the group consisting of chromium, nickel, cobalt, or manganese co-evaporated, or an alloy consisting essentially from 0.1 weight percent to 5.0 weight percent of at least one of the elements chromium, nickel, cobalt, or manganese with the balance being boron may be utilized instead. Ammonia gas is used as a source of nitrogen and an electrical field is generated in order to ionize the metal vapors and gas atoms in the zone.

DETAILED DESCRIPTION OF THE INVENTION

The invention involves the deposition of CBN on a substrate through activated reactive evaporation including the steps of (a) heating the substrate in a vacuum, (b) evaporating metal vapors into a zone between the substrate and the metals source, said source consisting of pure boron or an alloy consisting essentially of from 0.1 weight percent to 5.0 weight percent of at least one of the elements chromium, nickel, cobalt, or manganese, the balance being boron, (c) introducing ammonia gas into the zone, (d) generating an electrical field in the zone in order to ionize the metal vapors and gas atoms in the zone, thus producing a deposit in CBN on the surface of the substrate. The metal vapors may also be formed by co-evaporating boron and a material selected from the group consisting of chromium, nickel, cobalt, or manganese.

To practice the invention's method, one utilizes a vacuum chamber apparatus, such as illustrated in the aforementioned U.S. Pat. No. 3,791,852, Bunshah. Such an apparatus includes a vacuum chamber which may comprise a conventional cover or dome resting on a base with a sealing gasket at the lower rim of the cover. A support and feed unit for a source metal rod may be mounted in the base. The unit includes a mechanism for moving the metal rod upward at a controlled rate. Cooling coils may be mounted in the unit and supplied with cooling water from a cooling water source. An electron gun is mounted in the unit and provides an electron beam along the path to the upper surface of the metal rod, with the electron gun being energized from a power supply.

A substrate on which the CBN is to be deposited is supported in a frame on a rod projecting upward from the base. The substrate is heated by an electric resistance heater supported on a bracket. Energy for the heater is provided from a power supply via a cable. The temperature of the substrate is maintained at a desired value by means of a thermocouple in contact with the upper surface of the substrate, with the thermocouple connected to a controller by a line, with the controller output signal regulating the power from the supply to the heater.

The desired low pressure is maintained within the vacuum chamber by a vacuum pump connected to the interior of the chamber via a line. Ammonia gas from a supply is introduced into the zone between the metal rod and substrate via a line and nozzle. A shutter is mounted on a rod which is manually rotatable to move the shutter into and out of position between the metal rod and substrate.

A deflection electrode, typically a tungsten rod, is supported from the base in the reaction zone between the metal rod and substrate. An electric potential is provided for the rod from a voltage supply via a line. An electric insulating sleeve, typically of glass, is provided for the rod within the vacuum chamber, with the metal surface of the rod exposed only in the zone between the source and substrate. When a potential is connected to this electrode, some of the electrons from a region just above and/or adjacent to the molten pool, liberated at the end of the rod, are attracted to the reaction zone. The pool is the preferred source of electrons for the electrode, but a separate electron emitter could be added if desired.

Various components utilized in the apparatus described above may be conventional. The evaporation chamber may be a 24 inch diameter and 36 inch high water cooled stainless steel bell jar. The vacuum pump may be a 10 inch diameter fractionating diffusion pump, with an antimigration-type liquid nitrogen trap. The source metal unit may be a one inch diameter rod fed electron beam gun, self-accelerated 270° deflection type, such as Airco Temescal Model R1H-270. The power supply may be an Airco Temescal Model CV30, 30 kw unit which may be operated at a constant voltage such as 10 kilovolts, with a variable emission current.

Various sizes and shapes of substrates can be utilized. A typical substrate is a three inch by ten inch metal sheet in the order of five mils thick. Various metals have been used including stainless steel, titanium, and zirconium. Other substrate materials can be used including tool steels and carbides, such as WC/C alloy and SiC. In one embodiment the substrate is based about eight inches above the surface of the metal source. The heater may be a 18 kilowatt tantalum resistance heater providing for heating the substrate to 700° C. and higher temperatures, as desired.

The metals source material may be a solid rod or billet and for the just-described feed unit may approximate about one inch in diameter and six inches in length. The solid rod for the metals source may be provided by a preparation method in which particulate metals mixed together in the amount providing the desired requisite composition are melted and molten drops therefrom dripped or flowed into a water-cooled cylindrical mold of appropriate material and size.

Either pure boron or an alloy consisting essentially of 0.1 weight percent to 5.0 weight percent of at least one of the elements chromium, nickel, cobalt, or manganese, the balance being boron may be used as the metals source. If desired, dual source processing may be used to reduce the cost of fabrication and also ease the degree of control necessary to accomplish the formation of CBN. In this case, more than one source metal rod is utilized. In such a case, one rod could be pure boron and the other rod would be chromium, nickel, cobalt, or manganese.

The proper formation of CBN depends greatly upon the temperature of the substrate onto which it deposits. The substrate typically is at a temperature lower than the metals alloy source providing the metal vapors. Low substrate temperatures favor formation of powdery and less adherent deposits and lesser formation and/or deposit of CBN. For providing deposits of which the boron nitride content is appreciable, the substrate is preferably at an elevated temperature and generally heated to a temperature of at least 300° C. Preferred temperatures of the substrate are from about 500° C. to 1100° C. Especially preferred are substrate temperatures of about 900° C. to 1100° C. for at these temperatures the deposit can be provided with a greater than 75 percent by weight CBN content.

The present invention employs ammonia gas as the source of nitrogen in formation of the CBN placed on the substrate. This ammonia is admitted or introduced generally through needle valves at a rate adequately correlated with the rate at which the metal vapors are provided so that preferably at least the stoichiometric amount of nitrogen atoms from the gaseous ammonia molecule are present in the zone where activation or ionization of the gas atoms is provided. Of course, the partial pressure of the introduced ammonia gas needs be such that ionization can be provided, such as by the usual electrical field. A preferred range for gas pressure is about $1 \times 10^{-4}$ torr to $8 \times 10^{-3}$ torr.

Plasma activation is highly favored to effect the completion of the chemical reaction to produce CBN. To accomplish this employing the aforedescribed vacuum chamber apparatus, the deflection electrode, which is positioned between the molten metals alloy source and the substrate, is typically electrically biased to a potential of about +20 volts. The electrons, which are gathered from the region adjacent the surface of the molten pool of the metals alloy source, typically have low energies, 0.1 to 10 electron volts and large scattering cross-sections. Upon collision with neutral $NH_3$ gas molecules and/or B atoms, ions are created. Either the ionization phenomena or the presence of ultraviolet radiation typical of plasmas induces the chemical reaction which otherwise might not occur. It should be noted that other plasma-type processes also are contemplated as useful for the production of CBN, for example, reactive sputtering, reactive ion plating, hot hollow cathode reactive evaporation, and plasma enhanced thermal evaporation.

Although the invention has been described as applied to sheet substrates, other configurations are within the scope of the invention such as tool shapes which may have CBN deposited thereon. For example: reamers, gear cutters, and the like, may have CBN deposited thereon since there are very few restrictions on substrate geometry that exist in evaporating and coating.

Additionally, it is within the realm of the invention to contemplate producing a coating deposit-substrate interdiffusion, e.g., by heat treatment, to improve deposit adherence. Further, deposition of various alloying elements along with the CBN is contemplated for various purposes, such as improving deposit ductility. It has been noted that slight amounts of nickel deposited along with the CBN increases deposit ductility.

While this invention has been described in its preferred embodiment, it is to be appreciated variations therefrom may be made without departing from the true scope and spirit of the invention.

What is claimed is:

1. A method for depositing cubic boron nitride on a substrate, comprising the steps of:
   (a) heating a supported substrate in a vacuum;
   (b) supplying metal vapors into a zone between said substrate and a metals source, said source comprising a material selected from the group consisting of:
      boron,
      boron and a material selected from the group consisting of the elements chromium, nickel, cobalt, and manganese,
      and a metal alloy consisting essentially of from 0.1 weight percent to 5.0 weight percent of at least one of the elements chromium, nickel, cobalt, and manganese, the balance being boron;
   (c) introducing ammonia gas into said zone; and
   (d) generating an electrical field in said zone ionizing the metal vapors and gas atoms in the zone; whereby cubic boron nitride is deposited on the surface of said substrate.

2. The method of claim 1 including directing an electron beam onto the metals alloy source for providing the metal vapors by evaporation.

3. The method of claim 1 wherein the metal vapors are supplied by means of a sputtering cathode.

4. The method of claim 1 wherein the metal vapors are supplied by means of an arc discharge-type evaporation or sublimation process.

5. The method of claim 1 wherein the substrate is heated to between about 500° C. and 1100° C.

6. The method of claim 5 wherein the ammonia is introduced in an amount providing a gas partial pressure between about $1 \times 10^{-4}$ torr to $8 \times 10^{-3}$ torr in said zone.

7. The method of claim 6 involving generating the electrical field in said zone by imposing a voltage potential positive with respect to said source on a deflection electrode positioned between the substrate and the metals alloy source.

8. The method of claim 4 wherein the arc discharge-type evaporation or sublimation process involves the use of a hot hollow cathode.

* * * * *